United States Patent [19]

Sacks et al.

[11] Patent Number: 4,980,596
[45] Date of Patent: Dec. 25, 1990

[54] ACOUSTIC CHARGE TRANSPORT DEVICE HAVING DIRECT OPTICAL INPUT

[75] Inventors: Robert N. Sacks; Sears W. Merritt, both of Glastonbury, Conn.

[73] Assignee: United Technologies Corporation, Hartford, Conn.

[21] Appl. No.: 283,618

[22] Filed: Dec. 13, 1988

[51] Int. Cl.$^5$ .............................................. H01L 41/08
[52] U.S. Cl. ........................... 310/313 D; 310/313 R; 350/358
[58] Field of Search .......... 310/313 R, 313 A, 313 D; 324/77 R, 77 K; 357/24, 91; 364/821, 822, 860, 861, 728.1; 332/2, 3, 26; 350/358, 371–373, 162.12, 162.14; 346/157, 160; 333/151, 153, 194, 195

[56] References Cited

U.S. PATENT DOCUMENTS

| | | | |
|---|---|---|---|
| 3,886,527 | 5/1975 | Bert et al. | 310/313 R X |
| 3,903,364 | 9/1975 | Lean | 310/313 R X |
| 3,970,778 | 7/1976 | Adkins | 310/313 R X |
| 4,016,412 | 4/1977 | Stern et al. | 310/313 R X |
| 4,097,900 | 6/1978 | Moulin et al. | 310/313 R X |
| 4,380,864 | 4/1983 | Das | 310/313 R X |
| 4,525,442 | 6/1985 | Shirai et al. | 357/2 X |
| 4,592,130 | 6/1986 | Nash | 357/41 X |
| 4,600,853 | 7/1986 | Whitlock et al. | 310/313 R X |
| 4,611,140 | 9/1986 | Whitlock | 310/313 R X |
| 4,683,395 | 7/1987 | Mitsutsuka | 310/313 R |
| 4,695,790 | 9/1987 | Mathis | 324/77 K |
| 4,757,226 | 7/1988 | Mitsutka et al. | 310/313 R X |
| 4,758,895 | 7/1988 | Elabd | 358/213.26 |

Primary Examiner—Mark O. Budd
Attorney, Agent, or Firm—McCormick, Paulding & Huber

[57] ABSTRACT

A novel heterostructure acoustic charge transport (HACT) device is capable of direct optical modulation. The device includes a transducer fabricated on a substrate structure that launches surface acoustic waves. A reflector is formed in the substrate structure at an end portion adjacent to the transducer for reflecting the surface acoustic waves. Also included is an electrode configured with the transport channel at an end thereof distal to the transducer for generating electrical signal equivalents of the propagating electrode charge. The device is characterized by a transport channel with an intrinsic vertical electrical potential such that electron-hole pairs created by incident electromagnetic radiation are separated from one another before recombination, with electrical charges therefrom provided to the surface acoustic waves.

5 Claims, 1 Drawing Sheet

ACOUSTIC CHARGE TRANSPORT DEVICE HAVING DIRECT OPTICAL INPUT

TECHNICAL FIELD

This invention relates to acoustic charge transport devices and more particularly to acoustic charge transport devices capable of optical modulation.

CROSS-REFERENCE TO RELATED APPLICATIONS

Some of the subject matter hereof is disclosed and claimed in the commonly owned, copending U.S. Pat. applications entitled "Optically Modulated Acoustic Charge Transport Device" and "A Monolithic Electro-Acoustic Device Having An Acoustic Charge Transport Device Integrated With A Transistor", each of which is incorporated herein by reference.

BACKGROUND OF THE INVENTION

Acoustic charge transport (ACT) phenomena in III-IV semiconductor material has only recently been demonstrated. Such devices have applications as high speed analog signal processors. Delay lines have been fabricated in gallium arsenide (GaAs) substrates comprising a surface acoustic wave (SAW) transducer that launch a surface acoustic wave along an upper layer of the GaAs subtrate having transport channel formed therein. An input electrode sources charge to be transported by the propagating potential wells and an electrode receiving a signal for modulating that charge. Spaced down the transport channel are one or more nondestructive sensing (NDS) electrodes for sensing the propagating charge and finally an ohmic output electrode for removing the charge.

Initial acoustic charge transport devices comprised a thick epilayer (TE-ACT), with vertical charge confinement accomplished by means of an electrostatic DC potential applied to metal field plates on the top and bottom surfaces of the GaAs substrate. The field plate potentials are adjusted to fully deplete the epilayer and produce a potential maximum near the midpoint thereof. Consequently, any charge injected into the channel is confined to the region of maximum DC potential.

Lateral charge confinement (Y direction) has been achieved in several ways. Typically, a mesa is formed to define a charge transport channel. However, for thick epilayer acoustic transport devices, the mesa must be several microns in height, a fact which presents problems in fabrication and is a major impediment to the propagating surface acoustic wave. Blocking potentials extending down both sides of the delay line have also been used to define the transverse extend of the channel, as has proton bombardment to render the material surrounding the channel semi-insulating.

A heterostructure acoustic charge transport (HACT) device (HACT) has been fabricated using a GaAs/AlGaAs heterostructure that is similar to that of quantum well lasers and heterostructure field effect transistors FET (e.g. HFET, MODFET, HEMT and TEGFET devices). A HACT device vertically confines mobile carriers through the placement of potential steps that result from band structure discontinuities. Besides providing for inherent vertical charge confinement, the HACT devices are thin film devices whose layers have a total thickness of approximately 0.25 microns, excluding a buffer layer.

Known HACT devices provide only for electrical modulation of the charge propagating with the surface acoustic wave. It would be advantageous to have heterostructure acoustic charge transport device (HACT) which is capable of direct modulation by an optical beam. The present invention is drawn towards such a device.

SUMMARY OF THE INVENTION

An object of the present invention is to provide for a heterostructure acoustic charge transport device (HACT) that directly converts a modulated optical beam into corresponding electrical signals.

According to the present invention an acoustic charge transport device capable of direct optical modulation is formed on a piezoelectric semiconducting substrate and includes a transducer fabricated on a first surface thereof for launching surface acoustic waves along a propagation axis. The surface acoustic waves are characterized by maxima and minima of electrical potential and provide transport for electric charge provided thereto. A reflector is formed in the surface at an end portion there adjacent to the transducer for reflecting the surface acoustic waves. The device has a transport channel that is characterized an intrinsic vertical electrical potential such that electronholes charge pairs created by electromagnetic radiation incident thereto are separated from one another before re-combination, with electrical charges therefrom provided to the surface acoustic waves. The channel is further formed to provide lateral and vertical confinement of the propagating charge. The device also includes an electrode configured with the transport channel at an end thereof distal to the transducer for generating an electrical signal equivalent of the propagating electrical charge.

DESCRIPTION OF THE PREFERRED EMBODIMENT

Figure 1:
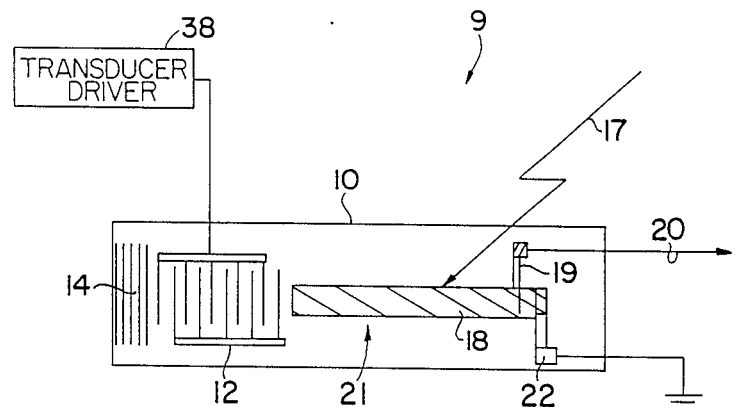
FIG. 1 is a simplified illustration of an electrical circuit having an acoustic charge transport device provided according to the present invention.

Referring now to FIG. 1 there is a schematic illustration of an electrical circuit 9 having an optically modulated acoustic charge transport device provided according to the present invention. The device 10 is preferably comprised of a III-IV material, such as GaAs and AlGaAs which is both piezoelectric and semiconducting. As is known, these materials are very closely lattice matched, having lattice parameters that differ by less than 0.0008 nm. As a result, their ternary solutions are nearly ideal for preparation by epitaxial growth. In addition, the energy band gap of an AlGaAs compound ($Al_xGa_{1-x}As$) increases monotonically with the parameter x up to x approximately equal to 0.4, at which point the band gap of the ternary becomes indirect. Potential steps as large as 0.3ev can be obtained in a heterostructure device. Moreover, the heterojunction band structure potential is a property of the composite material alone and is not diminished by the transport charge load. An example of an optically modulated HACT is described and claimed in the aforementioned U.S. Pat.

application entitled "Optically Modulated Acoustic Charge Transport Device".

On the surface of the device 10 there is formed a surface acoustic wave transducer 12 and reflector 14. The transducer is fabricated in a known manner and preferably comprises an interdigitated (IDT) transducer of aluminum copper alloy deposited in etched grooves in surface 16. Similarly, the reflector 14 comprises a plurality of etched grooves to reflect the surface acoustic wave along the surface 16. As detailed hereinafter, charge corresponding to an incident electromagnetic beam 17 is received by potential wells of the surface acoustic wave and is propagated along a transport channel 18. Schottky electrode 19 provides signals on line 20 corresponding to the modulated charge presented thereto. Finally, the charge is extracted from the device at the output ohmic electrode 22.

The device 10 provides vertical charge confinement through formation of a potential well within a GaAs-/AlGaAs layered structure using the differences in the conduction band energies of the contiguous layers. No external applied potentials are required for charge confinement in the vertical direction in the device 10. Lateral confinement of the propagating charge in the transport channel is preferably accomplished by conventional proton implant to produce a semi-insulating area 21 surrounding the channel 18 on the surface.

Figure 2:
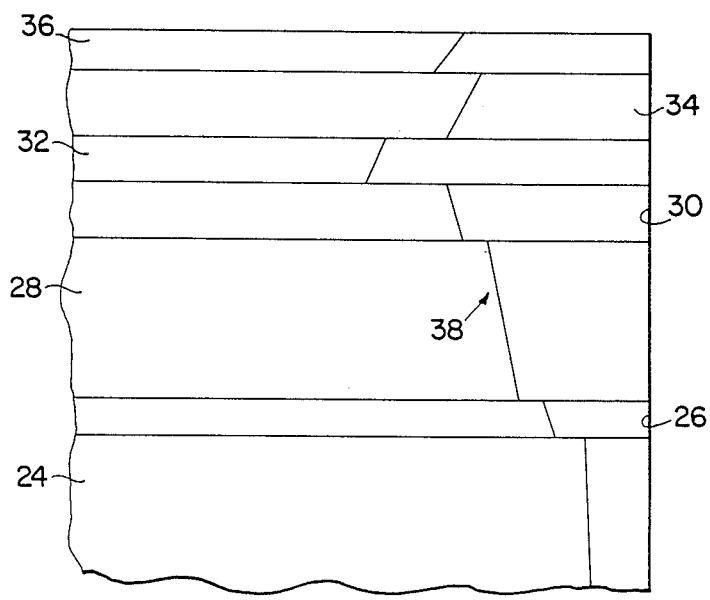
FIG. 2 is a diagrammatic illustration showing conduction band potential across several material layers in the device of FIG. 1.

FIG. 2 is a sectioned diagrammatic illustration of the device of FIG. 1, detailing the conduction band potential across the epitaxially grown layers thereof. As described hereinabove, the device 10 is a thin film heterostructure device whose charge confinement layers have a total thickness typically less than 0.25 microns, excluding any buffer layer. Consequently, the device is amenable to fabrication techniques, such as molecular beam epitaxy, which can generate structures with precisely controlled thickness and doping. One drawback to known devices however, is that direct optical modulation is essentially precluded, since optical absorption in GaAs occurs primarily at depths of one micron, well beyond the 0.04 micron thin film structure of the transport channel. The present invention overcomes this problem in that it is characterized by an epitaxial material structure that generates an intrinsic vertical electric field. Electron-hole charge pairs optically generated below the transport channel are separated by the electric field, with the electrons swept towards the surface where they are captured by the potential minimum in the transport channel.

Preferably, a device according to the present invention comprises a thin p-type GaAs or (Al,Ga)As layer formed approximately one micron below the transport channel, while also including the thin, n-type (Al,Ga)As layer typically present in a heterojunction ACT structure. A p-type -intrinsic - n-type (p-i-n) material is formed by this structure. The thickness and doping of the p-type layer should be selected to ensure that the layer will be fully depleted of mobile carriers. As a consequence of this material structure, the electrons of the optically generated electron-hole pairs are swept towards the upper surface of the device while holes are moved away. The electrons are transported and ultimately sensed, while the holes are trapped and eventually recombine with intrinsic background electrons.

On a semi-insulating GaAs substrate 24 there is formed a GaAs layer 26, preferably 30 nm in thickness, which is doped to approximately $3 \times 10^{17}/cm^3$. On this p-type layer 26 is grown a unintentionally doped approximately one micron thick layer 28 of GaAs. A first, unintentionally doped 100 nm thick layer 30 of (Al-Ga)As is then grown on the layer 28, which itself receives a 40 nm thick layer 32 of GaAs which forms the transport channel. A second, upper layer 34 of (Al-Ga)As is grown on the layer 32 with a doping of $2 \times 10^{17} cm^3$ and a thickness of about 70 nm. Finally, there is a cap layer 36 of unintentionally doped GaAs formed in order to prevent oxidation of the (AlGa)As charge control layer and to aid in electrical contact formation.

As demonstrated by the conduction band potentials shown in FIG. 2 (curve 38), a potential well 0.25 ev deep is created in the GaAs layer 32 which serves to confine the charge in the transport channel. The thickness and doping level of the (AlGa)As layer 34 is designed to provide a sufficient number of electrons to fill the surface states therein while leaving the remainder of the structure essentially free of excess carriers. In the device of FIG. 1, a mole fraction of 32% aluminum was used. As noted above, the heterostructure structure described with respect to FIG. 2 provides for vertical charge confinement and eliminates the need for backgating consideration and external biasing that is otherwise necessary for conventional acoustic charge transport devices. The GaAs transport channel is undoped to provide high electron mobility, and there is an increased charge transfer efficiency due to a limited charge packet volume and lower bulk charge trapping.

The transport channel formed in the device 10 differs from a double heterostructure FET devices in that charge in a FET transistor is supplied by donors in the (AlGa)As layers. However, in the HACT device 10, the transport channel is initially empty and charges are pulled into the channel. Direct optical coupling is accomplished by the intrinsic electric field formed in layers 26 and 28 which prevents the optically created electron-hole charge pairs from recombining and which sweeps the electrons into transport channel 32.

As noted above, a simplified schematic illustration of a circuit employing the device 10 is shown in FIG. 1. Besides the device 10, circuit 9 includes a transducer driver 38 for launching the surface acoustic waves along the transport channel. The electron hole pairs formed as optical beam 17 irradiates the device and generate a correspondingly modulated electrical signal at Schottky electrode 19. The signal presented at line 20 is therefore analogous to that provided by a conventional charge coupled device (CCD) imaging circuit.

Similarly, although the invention has been shown and described with respect to a preferred embodiment thereof, it should be understood by those skilled in the art that various other changes, omissions and additions thereto may be made therein without departing from the spirit and scope of the present invention.

We claim:
1. An acoustic charge transport device capable of direct optical modulation formed on a piezoelectric semiconducting substrate, said device comprising:
a transducer means fabricated on a first surface of the substrate for launching along a propagation axis surface acoustic waves characterized by maxima and minima of electrical potential which transport electric charge provided thereto;
a reflector means formed in said surface at an end portion thereof adjacent to said transducer means for reflecting said surface acoustic waves;

a transport channel characterized by an intrinsic vertical electrical potential such that electron-hole charge pairs created by incident electromagnetic radiation are separated from one another before recombination, with electrical charges therefrom provided to said surface acoustic waves, said channel formed in said substrate to provide lateral and vertical confinement of said propagating charges and further having a major dimension extending parallel to said propagation axis;

an electrode means configured with said transport channel at an end thereof distal to said transducer means for providing an electrical signal equivalent of said propagating electrical charge.

2. The device of claim 1 wherein said substrate comprises gallium arsenide and said transport channel is configured on a structure having

- a first doped layer on said substrate of gallium arsenide forming a p-type semiconductor layer;
- a second layer of gallium arsenide grown on said doped gallium arsenide;
- a first layer of aluminum gallium arsenide grown on said second layer of gallium arsenide;
- a third layer of gallium arsenide grown on said first layer of aluminum gallium arsenide;
- a second doped layer of aluminum gallium arsenide grown on said second layer of aluminum gallium arsenide; and
- a fourth cap layer of gallium arsenide grown on said second layer of aluminum gallium arsenide.

3. The device of claim 1 wherein said structure further comprises an ion implanted region encompassing said transport channel for providing lateral confinement of said propagating charge.

4. An electrical circuit for use in converting an optically modulated beam into corresponding electrical modulation signals, comprising:

a direct optically modulated acoustic charge transport device, having an acoustic charge transport structure formed on a piezoelectric semiconducting substrate including a transducer means fabricated on a first surface of the substrate for launching surface acoustic waves along a propagation axis corresponding to received signals, said surface acoustic waves characterized by maxima and minima of electrical potential which transport electric charge provided thereto;

a reflector means formed in said surface at an end portion thereof adjacent to said transducer means for reflecting said surface acoustic waves;

a transport channel characterized by an intrinsic vertical electrical potential such that electron-hole charge pairs created by incident electromagnetic radiation are separated from one another before recombination, with electrical charges therefrom provided to said surface acoustic waves, said channel formed in said substrate to provide lateral and vertical confinement of said propagating charges and further having a major dimension extending parallel to said propagation axis;

an electrode means configured with said transport channel at an end thereof distal to said transducer means for generating an electrical signal equivalent of said propagating electrical charge; and a transducer drive means for supplying to said transducer means said electrical signals for exciting said surface acoustic waves.

5. The device of claim 4 wherein said structure further comprises an ion implanted region encompassing said transport channel for providing lateral confinement of said propagating charge.

* * * * *